(12) United States Patent
Sugai et al.

(10) Patent No.: US 8,432,947 B2
(45) Date of Patent: Apr. 30, 2013

(54) SEMICONDUCTOR LIGHT EMITTING DEVICE (75) Inventors: Maki Sugai, Tokyo (JP); Shinji Saito, Kanagawa-ken (JP); Rei Hashimoto, Tokyo (JP); Yasushi Hattori, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 120 days.

(21) Appl. No.: 12/719,468

(22) Filed: Mar. 8, 2010

(65) Prior Publication Data

US 2011/0051769 A1 Mar. 3, 2011

(30) Foreign Application Priority Data

Aug. 31, 2009 (JP) ................. 2009-200651

(51) Int. Cl.
*H01S 5/00* (2006.01)
(52) U.S. Cl.
USPC ............ 372/45.011; 372/43.01; 372/87; 372/38.05; 257/96; 257/98; 257/E33.055
(58) Field of Classification Search ........... 372/45.011, 372/43.01, 87, 38.05; 257/81, 96, 98, E33.055, 257/E33.006, E33.065
See application file for complete search history.

(56) References Cited

U.S. PATENT DOCUMENTS

| | | | |
|---|---|---|---|
| 6,414,976 B1 * | 7/2002 | Hirata .................... | 372/45.013 |
| 6,807,213 B1 * | 10/2004 | Shimoyama et al. ...... | 372/49.01 |
| 7,167,489 B2 * | 1/2007 | Kawakami et al. ............ | 372/19 |
| 7,397,069 B2 | 7/2008 | Tachibana et al. | |
| 7,683,390 B2 | 3/2010 | Tachibana et al. | |
| 7,729,401 B2 * | 6/2010 | Takayama et al. ......... | 372/49.01 |
| 7,885,305 B2 * | 2/2011 | Watanabe et al. .......... | 372/45.01 |
| 2003/0112842 A1 * | 6/2003 | Crawford ....................... | 372/46 |
| 2006/0274802 A1 * | 12/2006 | Aoki et al. ................. | 372/45.01 |

(Continued)

FOREIGN PATENT DOCUMENTS

| | | |
|---|---|---|
| JP | 59-154089 | 9/1984 |
| JP | 6-188511 | 7/1994 |
| JP | 8-340147 | 12/1996 |
| JP | 2004-55938 | 2/2004 |

OTHER PUBLICATIONS

Office Action issued Oct. 11, 2012 in Japanese Application No. 2009-200651 filed Aug. 31, 2009 (w/English-language translation).

*Primary Examiner* — Jessica Stultz
*Assistant Examiner* — Delma R Forde
(74) *Attorney, Agent, or Firm* — Oblon, Spivak, McClelland, Maier & Neustadt, L.L.P.

(57) ABSTRACT

A semiconductor light emitting device includes: a stacked body including a first and a second semiconductor layers of a first and second conductivity types respectively, and a light emitting layer provided between thereof; a first and a second electrodes in contact with the first and second semiconductor layers respectively. Light emitted is resonated between first and second end surfaces of the stacked body opposed in a first direction. The second semiconductor layer includes a ridge portion and a wide portion. A width of the ridge portion along a second direction perpendicular to the first and the stacking directions is narrower on the second electrode side than on the light emitting layer side. A width of the wide portion along the second direction is wider than the ridge portion. A width of the narrow part of the second electrode along the second direction is narrower than that on the ridge portion

25 Claims, 9 Drawing Sheets

U.S. PATENT DOCUMENTS

| | | |
|---|---|---|
| 2007/0014323 A1 | 1/2007 | Tachibana et al. |
| 2008/0043797 A1* | 2/2008 | Takayama et al. ......... 372/50.12 |
| 2008/0298415 A1* | 12/2008 | Kishino et al. ........... 372/45.012 |
| 2009/0059986 A1 | 3/2009 | Tachibana et al. |
| 2010/0080255 A1* | 4/2010 | Sugahara ................... 372/45.01 |
| 2010/0102296 A1 | 4/2010 | Tachibana et al. |
| 2011/0058586 A1* | 3/2011 | Takizawa et al. .......... 372/45.01 |

* cited by examiner

SEMICONDUCTOR LIGHT EMITTING DEVICE

CROSS-REFERENCE TO RELATED APPLICATIONS

This application is based upon and claims the benefit of priority from the prior Japanese Patent Application No. 2009-200651, filed on Aug. 31, 2009; the entire contents of which are incorporated herein by reference.

BACKGROUND OF THE INVENTION

This invention relates to a semiconductor light emitting device.

A semiconductor laser with a higher output power undergoes such degradation as catastrophic optical damage (COD) due to the increase of optical density and temperature in the light emitting portion, which leads to degradation in reliability.

To solve this problem, JP-A 6-188511 (1994) (Kokai) proposes a configuration of a semiconductor laser device with a ridge mesa. In this configuration, the ridge mesa is formed except in a region near the low reflectance side of the resonator, and a polyimide layer is provided near the resonator end surface between the electrode and the cladding layer so as to prevent the current from being injected into the neighborhood of the resonator end surface. However, in this configuration, there is concern about degradation in operating characteristics, such as increased threshold current and decreased efficiency.

SUMMARY OF THE INVENTION

According to an aspect of the invention, there is provided a semiconductor light emitting device including: a stacked body including a first semiconductor layer of a first conductivity type, a second semiconductor layer of a second conductivity type, and a light emitting layer provided between the first semiconductor layer and the second semiconductor layer, the stacked body having a stacking direction from the first semiconductor layer to the second semiconductor layer, a first direction perpendicular to the stacking direction, and a second direction perpendicular to the first direction and the stacking direction, the stacked body having a first end surface and a second end surface opposed to the first end surface in the first direction; a first electrode provided in contact with the first semiconductor layer; and a second electrode provided in contact with the second semiconductor layer, light emitted from the light emitting layer being resonated between the first end surface and the second end surface, the second semiconductor layer including: a ridge portion a width of the ridge portion on a side of the second electrode along a second direction being narrower than a width of the ridge portion on a side of the light emitting layer along the second direction; and a wide portion provided in contact with at least one of the first end surface and the second end surface, a width of the wide portion on a side of the second electrode along the second direction being wider than the width of the ridge portion on a side of the second electrode along the second direction, and the second electrode including a narrow part and a wide part, the narrow part being in contact with the wide portion, the wide part being in contact with the ridge portion, a width of the narrow portion along the second direction being narrower than a width of the wide part along the second direction.

DETAILED DESCRIPTION

Embodiments of the invention will now be described with reference to the drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the specification and drawings of the application, the same elements as those described previously with reference to earlier figures are labeled with like reference numerals, and the detailed description thereof is omitted as appropriate.

First Embodiment

FIGS. 1A to 1D are schematic views illustrating the configuration of a semiconductor light emitting device according to a first embodiment of the invention.

Figure 1A:
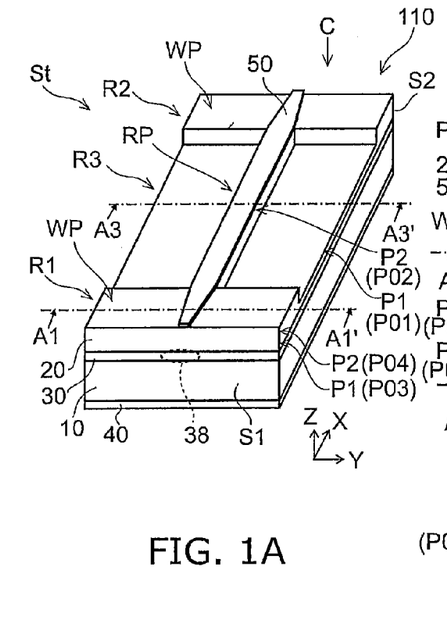
FIGS. 1A to 1D are schematic views illustrating a semiconductor light emitting device according to a first embodiment.
Figure 1B:
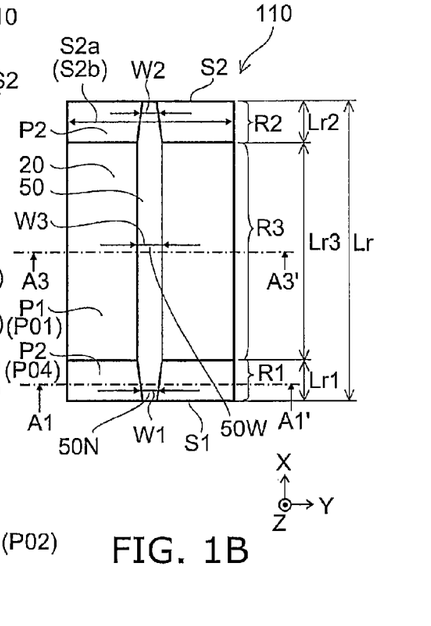
Figure 1C:
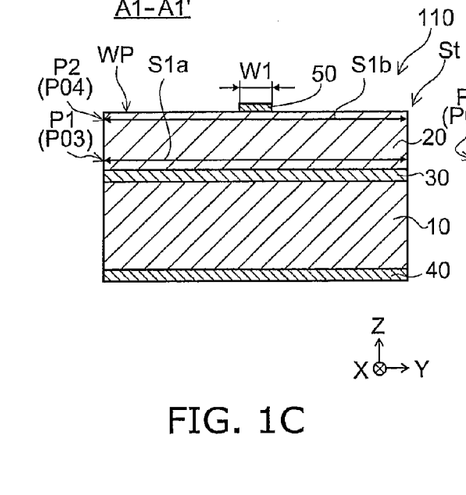
Figure 1D:
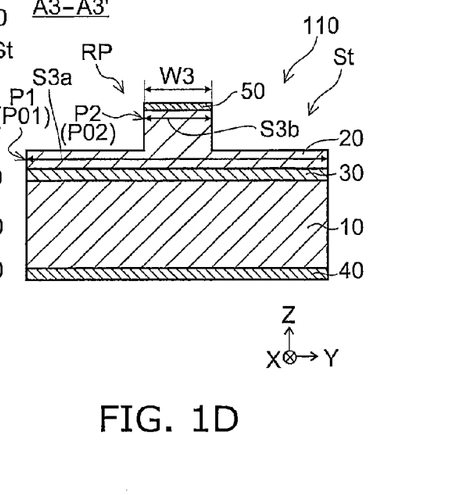

More specifically, FIG. 1A is a schematic perspective view of a semiconductor light emitting device 110, FIG. 1B is a schematic plan view thereof as viewed in direction C of FIG. 1A, and FIGS. 1C and 1D are cross-sectional views taken along line A1-A1' and line A3-A3' of FIG. 1A, respectively.

As shown in FIGS. 1A to 1D, the semiconductor light emitting device 110 according to the first embodiment of the invention includes a stacked body St, a first electrode 40, and a second electrode 50.

The stacked body St includes a first semiconductor layer 10 of a first conductivity type, a second semiconductor layer 20 of a second conductivity type, and a light emitting layer 30 provided between the first semiconductor layer 10 and the second semiconductor layer 20.

The first electrode 40 is provided in contact with the first semiconductor layer 10, and the second electrode 50 is provided in contact with the second semiconductor layer 20.

Here, the first conductivity type is illustratively n-type, and the second conductivity type is illustratively p-type. However, the first conductivity type may be p-type, and the second conductivity type may be n-type. In the following description, as an example, it is assumed that the first conductivity type is n-type and the second conductivity type is p-type.

The stacked body St has a stacking direction from the first semiconductor layer 10 to the second semiconductor layer 20, a first direction perpendicular to the stacking direction, and a second direction perpendicular to the first direction and the stacking direction.

The semiconductor light emitting device 110 has a first end surface S1 and a second end surface S2. That is, the stacked body St has the first end surface S1 and the second end surface S2. The second end surface S2 is opposed to the first end surface S2 in the first direction. The first end surface S1 and the second end surface S2 constitute a resonator.

More specifically, in the semiconductor light emitting device 110, light emitted from the light emitting layer 30 is resonated between the first end surface S1 and the second end surface S2 of the stacked body St opposed to each other in a first direction perpendicular to the stacking direction of the stacked body St. It is noted that the stacking direction is the direction in which the first semiconductor layer 10, the light emitting layer 30, and the second semiconductor layer 20 are stacked. That is, the semiconductor light emitting device 110 is a semiconductor laser. Here, the first end surface S1 and the second end surface S2 are light emitting end surfaces. That is, a light emitting portion 38 is provided in the light emitting layer 30 (and a region therearound) at the first end surface S1 and in the light emitting layer 30 (and a region therearound) at the second end surface S2.

Here, the stacking direction of the first semiconductor layer 10, the light emitting layer 30, and the second semiconductor layer 20 is defined as a Z-axis direction. Furthermore, one direction perpendicular to the Z-axis direction is defined as an X-axis direction, and the direction perpendicular to the Z-axis direction and the X-axis direction is defined as a Y-axis direction.

A first direction along which the first end surface S1 and the second end surface S2 are opposed to each other is set in the X-axis direction. Furthermore, the direction perpendicular to the stacking direction and the first direction is defined as a second direction and set in the Y-axis direction.

The light emitting layer 30 illustratively includes a plurality of barrier layers and well layers each provided between adjacent ones of the plurality of barrier layers. The barrier layers and the well layers are stacked in the Z-axis direction. That is, the light emitting layer 30 has a multiple-quantum-well (MQW) structure. The number of well layers in the light emitting layer 30 is illustratively three. However, the invention is not limited thereto, but the number of well layers is arbitrary.

The second semiconductor layer 20 includes a ridge portion RP and a wide portion WP.

The ridge portion RP is provided between the first end surface S1 and the second end surface S2. In the ridge portion RP, the width along the second direction perpendicular to the first direction and the stacking direction is narrower on the second electrode 50 side than on the light emitting layer 30 side.

The wide portion WP is provided in contact with at least one of the first end surface S1 and the second end surface S2. The width of the wide portion WP along the second direction on the second electrode 50 side is wider than that of the ridge portion RP.

The second electrode 50 on the wide portion WP includes a portion whose width along the second direction is narrower than that of the second electrode 50 on the ridge portion RP. That is, the second electrode 50 includes a narrow part and a wide part. The narrow part is in contact with the wide portion WP and the wide part is in contact with the ridge portion RP. A width of the narrow portion along the second direction is narrower than a width of the wide part along the second direction.

In this example, the wide portion WP is provided on both the first end surface S1 side and the second end surface 52 side. One wide portion WP is provided in contact with the first end surface S1, and the width along the second direction of the portion on the first end surface S1 side of the second electrode 50 is narrower than the width along the second direction of the portion on the ridge portion RP side of the second electrode 50. Another wide portion WP is provided in contact with the second end surface S2, and the width along the second direction of the portion on the second end surface 52 side of the second electrode 50 is narrower than the width along the second direction of the portion on the ridge portion RP side of the second electrode 50.

In other words, the semiconductor light emitting device 110 illustratively includes a first region R1, a second region R2, and a third region R3.

The first region R1 is in contact with the first end surface S1. The second region R2 is in contact with the second end surface S2. The third region R3 is a region between the first region R1 and the second region R2. That is, the third region R3 is a central region.

The second semiconductor layer 20 includes a first portion P1 (a first portion P01 and a third portion P03) and a second portion P2 (a second portion P02 and a fourth portion PO4). The first portion P1 is a portion on the light emitting layer 30 side of the second semiconductor layer 20. The second portion P2 is a portion on the second electrode 50 side of the second semiconductor layer 20. The first portion P1 is illustratively a portion of the second semiconductor layer 20 in contact with the light emitting layer 30. The second portion P2 is illustratively a portion of the second semiconductor layer 20 in contact with the second electrode 50.

In the third region R3, the length (third upper width S3$b$) along the second direction (Y-axis direction) perpendicular to the stacking direction (Z-axis direction) and the first direction (X-axis direction), along which the first end surface S1 and the second end surface S2 are opposed to each other, of the second portion P2 on the second electrode 50 side of the second semiconductor layer 20 is shorter than the length (third lower width S1$a$) along the second direction (Y-axis direction) of the first portion P1 on the light emitting layer 30 side of the second semiconductor layer 20.

The portion where the length along the second direction of the second portion P2 of the second semiconductor layer 20 is shorter than the length along the second direction of the first portion P1 of the second semiconductor layer 20 constitutes a ridge portion RP. That is, the third region R3 includes a ridge portion RP. This ridge portion RP aligns in the X-axis direction.

The length (first upper width S1$b$ and second upper width S2$b$) along the second direction (Y-axis direction) of the second portion P2 in the first region R1 and the second region R2 is longer than the length (third upper width S3$b$) along the second direction (Y-axis direction) of the second portion P2 in the third region R3. That is, the width of the second portion P2 of the second semiconductor layer 20 is wider in the end region near the first end surface S1 and the second end surface S2 than in the ridge portion RP in the central region. In other words, a wide portion WP is provided in at least one of the first region R1 and the second region R2.

Furthermore, the length (first electrode width W1 and second electrode width W2) along the second direction (Y-axis direction) of the second electrode 50 in the first region R1 (a narrow part 50N) and the second region R2 is shorter than the length (third electrode width W3) along the second direction (Y-axis direction) of the second electrode 50 in the third region R3 (a wide part 50W). That is, the width of the second electrode 50 is narrower in the end region near the first end surface S1 and the second end surface S2 than in the central region.

It is noted that the length along the second direction (Y-axis direction) is referred to as "width" where appropriate, and the length along the X-axis direction (first direction) is referred to as "length" where appropriate.

As described above, in this example, the wide portion WP is provided in both the first region R1 and the second region R2, and the width of the second electrode 50 is narrower in both the first region R1 and the second region R2 than in the central region. However, the invention is not limited thereto.

That is, as described later, the length along the second direction of the second portion P2 in at least one region of the first region R1 and the second region R2 may be longer than the length along the second direction of the second portion P2 in the third region R3, and the length along the second direction of the second electrode 50 in at least one region of the first region R1 and the second region R2 may be shorter than the length along the second direction of the second electrode 50 in the third region R3.

More specifically, in the semiconductor light emitting device 110 according to this embodiment, in the third region R3, the length along the second direction of the second portion P2 of the second semiconductor layer 20 is shorter than the length along the second direction of the first portion P1 of the second semiconductor layer 20, the length along the second direction of the second portion P2 in the first region R1 is longer than the length along the second direction of the second portion P2 in the third region R3, and the length along the second direction of the second electrode 50 in the first region R1 is shorter than the length along the second direction of the second electrode 50 in the third region R3.

In the semiconductor light emitting device 110 thus configured, a wide portion WP is provided in at least one of the first region R1 and the second region R2 near the first end surface S1 and the second end surface S2 forming the resonator. That is, in this portion, no ridge feature is provided, or the upper (on the second electrode 50 side) width of the ridge feature is wider than in the third region R3 (central region). This can reduce the increase of optical density and temperature at the light emitting end surface and suppress the occurrence of COD and the like, thereby improving reliability.

Furthermore, in at least one region of the first region R1 and the second region R2 where no ridge feature is provided or the upper width of the ridge feature is wider than in the third region R3, the width of the second electrode 50 is narrower than in the third region R3. This suppresses the increase of threshold current and the decrease of light emission efficiency caused when no ridge feature is provided or the upper width of the ridge feature is wider than in the third region R3. Thus, high operating characteristics can be maintained.

Thus, the semiconductor light emitting device 110 can achieve high reliability while maintaining high operating characteristics and reducing catastrophic optical damage.

In the following, specific examples of the configuration of the semiconductor light emitting device 110 are described.

Figure 2A:
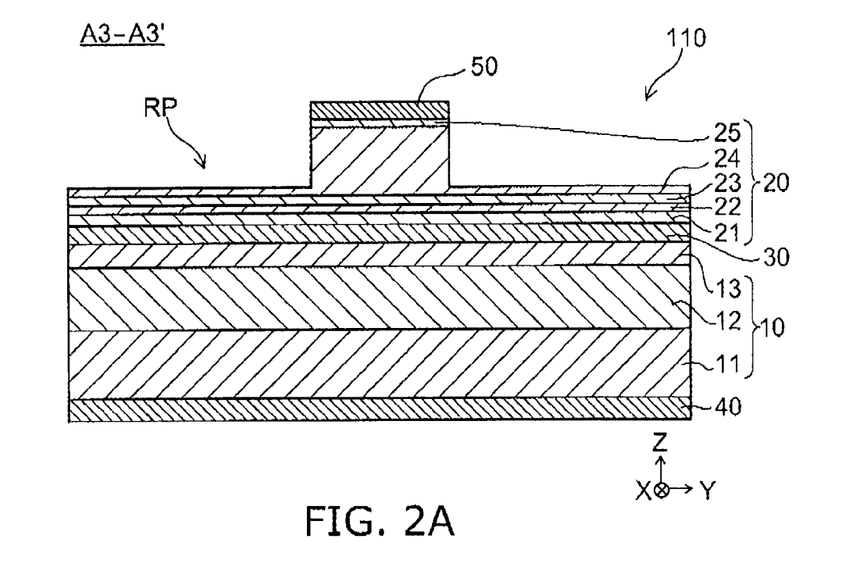
FIGS. 2A to 2C are schematic cross-sectional views illustrating the semiconductor light emitting device according to the first embodiment.
Figure 2B:
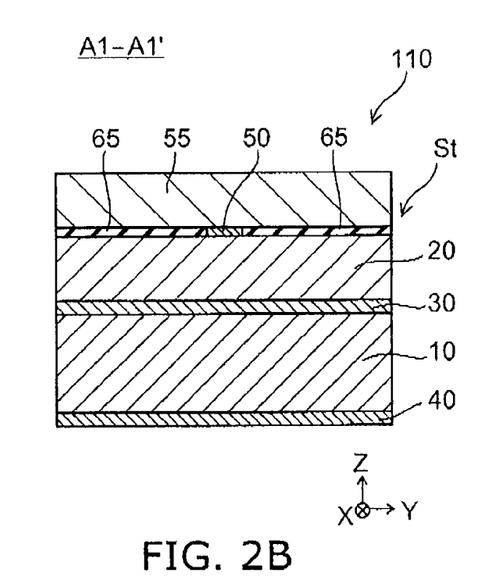
Figure 2C:
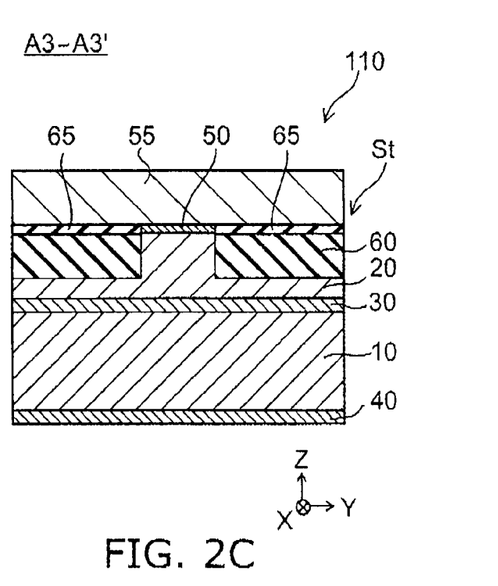

FIGS. 2A to 2C are schematic cross-sectional views illustrating the configuration of the semiconductor light emitting device according to the first embodiment of the invention.

More specifically, FIGS. 2A to 2C show a specific example of the configuration of the semiconductor light emitting device 110, where FIG. 2A shows an example of the A3-A3' cross section in FIG. 1A, and FIGS. 2B and 2C are cross-sectional views corresponding to the cross sections taken along line A1-A1' and line A3-A3' of FIG. 1A, respectively, illustrating the insulating layer and conductive layer provided in the semiconductor light emitting device 110.

As shown in FIG. 2A, the first semiconductor layer 10 illustratively includes an n-GaN buffer layer 11, an n-AlGaN cladding layer 12, and an n-GaN guide layer 13, which are sequentially stacked. The n-GaN buffer layer 11 is illustratively a Si-doped GaN layer having a thickness of e.g. 2000 nm (nanometers). The n-AlGaN cladding layer 12 is illustratively a Si-doped AlGaN layer having a thickness of e.g. 2000 nm. The n-GaN guide layer 13 is illustratively a Si-doped GaN layer having a thickness of e.g. 70 nm.

The well layer and the barrier layer of the light emitting layer 30 are illustratively InGaN layers, with the In concentration made different between in the well layer and in the barrier layer.

The second semiconductor layer 20 illustratively includes an i-GaN guide layer 21, a p-AlGaN electron barrier layer 22, a p-GaN guide layer 23, a p-AlGaN cladding layer 24, and a p-GaN contact layer 25, which are sequentially stacked. The i-GaN guide layer 21 is illustratively a non-doped GaN layer having a thickness of e.g. 45 nm. The p-AlGaN electron barrier layer 22 is illustratively a Mg-doped AlGaN layer having a thickness of e.g. 15 nm. The p-GaN guide layer 23 is illustratively a Mg-doped GaN layer having a thickness of e.g. 30 nm. The p-AlGaN cladding layer 24 is illustratively a Mg-doped AlGaN layer having a thickness of e.g. 600 nm. The p-GaN contact layer 25 is illustratively a Mg-doped GaN layer having a thickness of e.g. 18 nm.

In forming the aforementioned layers, for instance, on a substrate with the GaN (0001) surface used as a major surface, crystal growth of the first semiconductor layer 10 is performed via a buffer layer as needed, and crystal growth of the light emitting layer 30 and the second semiconductor layer 20 is sequentially performed thereon. This crystal growth is illustratively based on the MOCVD process.

As shown in FIG. 2C, part of the second semiconductor layer 20 in the third region R3 of the aforementioned stacked structure is removed illustratively by dry etching to form a ridge portion RP. Then, an insulating layer 60 is provided on the exposed upper surface of the second semiconductor layer 20.

That is, the semiconductor light emitting device 110 can further include an insulating layer 60 provided on the surface on the second electrode 50 side of the portion on the light emitting layer 30 side of the ridge portion RP. In other words, the semiconductor light emitting device 110 can further include an insulating layer 60 provided on the surface on the second electrode 50 side of the first portion P1 of the second semiconductor layer 20.

Furthermore, as shown in FIGS. 2B and 2C, the second electrode 50 is provided in a prescribed shape, and an interlayer insulating film 65 is provided on the region of the second semiconductor layer 20 not covered with the second electrode 50 and on the insulating layer 60. Furthermore, a conductive layer 55 (pad electrode) is provided so as to cover the second electrode 50 and the interlayer insulating film 65. The conductive layer 55 is in contact with the second electrode 50. On the other hand, a first electrode 40 is provided on the surface of the first semiconductor layer 10 opposite to the light emitting layer 30.

The aforementioned insulating layer 60 and interlayer insulating film 65 can be made of arbitrary insulating materials. In this example, the insulating layer 60 is made of $ZrO_2$, and the interlayer insulating film 65 is made of $SiO_2$.

The first electrode 40, the second electrode 50, and the conductive layer 55 can be made of arbitrary conductive materials. In this example, the first electrode 40 is made of a stacked film of Ti/Pt/Au, the second electrode 50 is made of a stacked film of Ni/Au, and the conductive layer 55 is made of Au.

In the following, the characteristics of the semiconductor light emitting device 110 are described with reference to comparative examples.

FIGS. 3A to 3D and FIG. 4 are schematic perspective views illustrating the configuration of semiconductor light emitting devices of comparative examples.

More specifically, FIGS. 3A to 3D and FIG. 4 illustrate the configuration of semiconductor light emitting devices 119a-119e of first to fifth comparative examples, respectively.

Figures 3A, 3B:
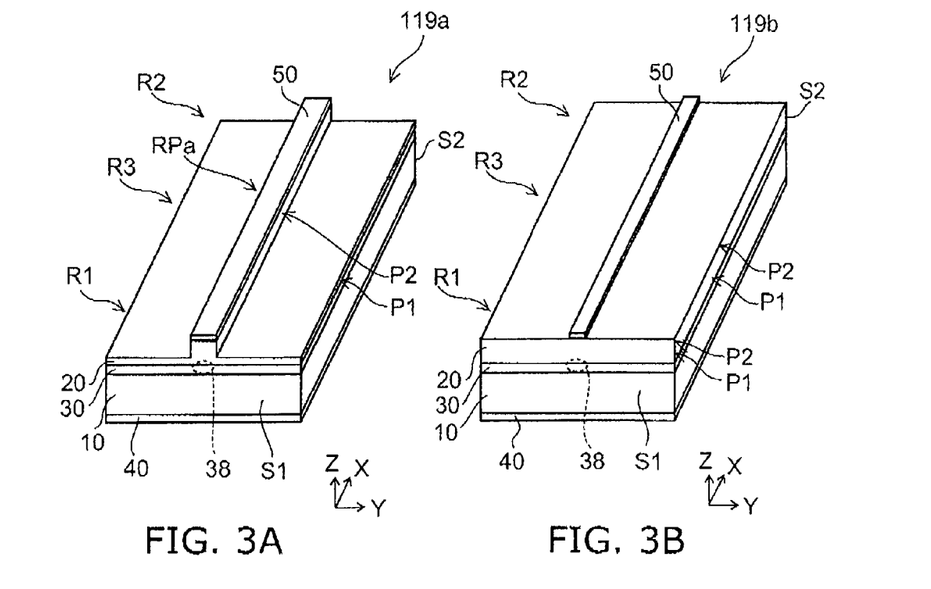
FIGS. 3A to 3D and FIG. 4 are schematic perspective views illustrating semiconductor light emitting devices of comparative examples.

As shown in FIG. 3A, in the semiconductor light emitting device 119a of the first comparative example, a ridge portion RPa is provided in all the first to third regions R1-R3. More specifically, the width (first upper width S1b and second upper width S2b) of the second portion P2 of the second semiconductor layer 20 in the first region R1 and the second region R2 is narrower than the width (first lower width S1a and second lower width S2a) of the first portion P1 and equal to the width (third upper width S3b) in the third region R3. In the semiconductor light emitting device 119a thus configured, at the light emitting end surface, the optical density increases, and the temperature increases accordingly. This results in COD and the like and decreases reliability.

As shown in FIG. 3B, in the semiconductor light emitting device 119b of the second comparative example, no ridge portion RPa is provided in all the first to third regions R1-R3. In the semiconductor light emitting device 119b thus configured, the optical density is relatively low, and the temperature increase is also low. Hence, COD and the like are suppressed. However, the threshold current increases, and the light emission efficiency decreases accordingly. This results in low operating characteristics.

Figures 3C, 3D:
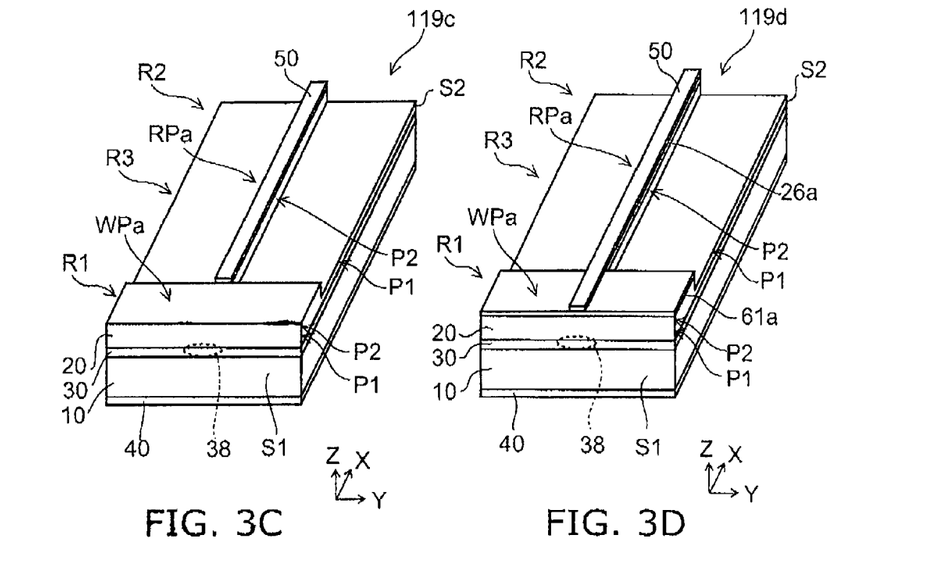

As shown in FIG. 3C, in the semiconductor light emitting device 119c of the third comparative example, a ridge portion RPa is provided in the second region R2 and the third region R3.

However, the ridge portion RPa is not provided in the first region R1, but a wide portion WPa is provided therein. Furthermore, the second electrode 50 is not provided in the wide portion WPa (first region R1). That is, the second electrode 50 is set back along the X-axis direction from the first end surface S1. In the semiconductor light emitting device 119c thus configured, because the ridge portion RPa is not provided in the first region R1, the increase of optical density and temperature at the light emitting end surface (first end surface S1) is reduced, and the occurrence of COD and the like is suppressed. However, the second electrode 50 is set back from the first end surface S1, and no current is injected near the first end surface S1. Hence, the threshold current increases, and the light emission efficiency is low.

As shown in FIG. 3D, in the semiconductor light emitting device 119d of the fourth comparative example, a ridge portion RPa is provided in the second region R2 and the third region R3. However, the ridge portion RPa is not provided in the first region R1, but a wide portion WPa is provided therein. Furthermore, in the wide portion WPa (first region R1), the second electrode 50 is provided on the second semiconductor layer 20 via an insulating film 61a illustratively made of polyimide. In the second region R2 and the third region R3, a cap layer 26a is provided as a layer of the second semiconductor layer 20 nearest to the second electrode 50, and the second electrode 50 is in contact with the second semiconductor layer 20 including this cap layer 26a. That is, the insulating film 61a provided on the first end surface S1 side provides a current non-injection region, which prevents the second electrode 50 from injecting the current into the second semiconductor layer 20 near the first end surface S1. In the semiconductor light emitting device 119d thus configured, the occurrence of COD and the like is suppressed. However, because no current is injected from the second electrode 50 near the first end surface S1, the threshold current increases, and the light emission efficiency is low. Furthermore, the aforementioned current non-injection region may cause optical absorption, which also decreases the light emission efficiency.

In contrast, in the semiconductor light emitting device 110 according to this embodiment, the second electrode 50 is not set back along the X-axis direction from the first end surface S1 (and the second end surface S2). That is, the second electrode 50 is provided substantially in contact with the first end surface S1 (and the second end surface S2). In other words, the second electrode 50 is provided on the entire area along the X-axis direction of the resonator in which the first end surface S1 and the second end surface S2 are opposed to each other. Thus, the current can be injected also at the first end surface S1 (and the second end surface S2). Furthermore, the width (length along the Y-axis direction) of the second electrode 50 is made narrower than in the central region (third region R3) to constrict the current. This can suppress the decrease of light emission efficiency while suppressing the increase of threshold current.

In the foregoing, the second electrode 50 may be spaced by a slight distance from the first end surface S1 (and the second end surface S2) due to, for instance, variation in the manufacturing process. Furthermore, the second electrode 50 may be spaced by a slight distance from the first end surface (and the second end surface S2) to prevent the end of the second electrode 50 from partly peeling due to, for instance, cracks and the like in the first end surface S1 (and the second end surface S2) and decreasing the yield. That is, the second electrode 50 only needs to be provided substantially in contact with the first end surface S1 (and the second end surface S2) so that the current can be injected substantially into the entire area along the X-axis direction of the resonator in which the first end surface 51 and the second end surface S2 are opposed to each other. Thus, the second electrode 50 is provided substantially in contact with the first end surface S1 and the second end surface 52, and the current is injected into the stacked body St in the substantially entire area along the first direction between the first end surface S1 and the second end surface S2 opposed to each other.

Figure 4:
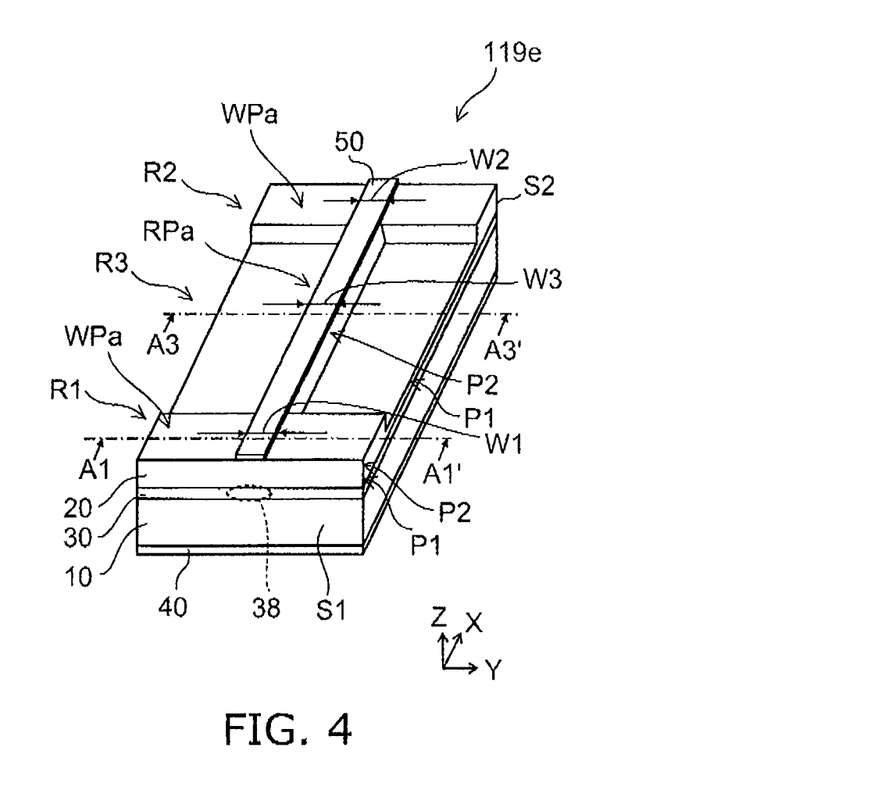

As shown in FIG. 4, in the semiconductor light emitting device 119e of the fifth comparative example, a ridge portion RPa is provided in the third region R3, and a wide portion WPa is provided in the first region R1 and the second region R2. Furthermore, the width (first electrode width W1 and second electrode width W2) of the second electrode 50 in the wide portion WPa (first region R1 and second region R2) is equal to the width (third electrode width W3) of the second electrode 50 in the third region R3. Thus, in the semiconductor light emitting device 119e, the configuration of the second semiconductor layer 20 is the same as that in the semiconductor light emitting device 110, but the configuration of the second electrode 50 is different from that in the semiconductor light emitting device 110, and the width of the second electrode 50 is constant across the first to third regions R1-R3. In the semiconductor light emitting device 119e thus configured, because of the wide width of the second electrode 50 in the wide portion WPa (first region R1 and second region R2), the current constriction effect cannot be achieved. Thus, the threshold current is higher and the light emission efficiency is lower than in the semiconductor light emitting device 110.

Thus, the semiconductor light emitting device 110 according to this embodiment can achieve high reliability while maintaining high operating characteristics and reducing catastrophic optical damage.

Furthermore, the semiconductor light emitting device 110 includes a wide portion WP at the first end surface S1 and the second end surface S2, which are light emitting end surfaces. This can increase the yield and other manufacturing efficiency, such as decreasing damage at the time of cleavage in manufacturing the semiconductor light emitting device 110. Thus, this also improves reliability. Here, the semiconductor light emitting device 110 can be manufactured by partially modifying the conventional method for manufacturing a semiconductor laser device of the ridge waveguide type, for instance.

In the following, variations of the semiconductor light emitting device according to this embodiment are described.

FIGS. 5A to 5D are schematic views illustrating the configuration of other semiconductor light emitting devices according to the first embodiment of the invention.

Figure 5A:
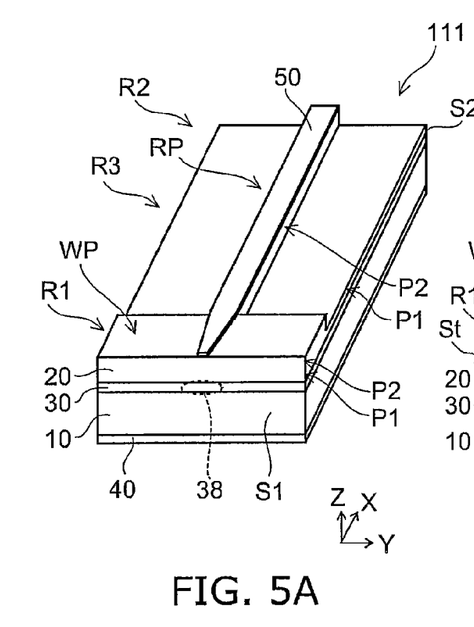
FIGS. 5A to 5D are schematic views illustrating other semiconductor light emitting devices according to the first embodiment of the invention.
Figure 5B:
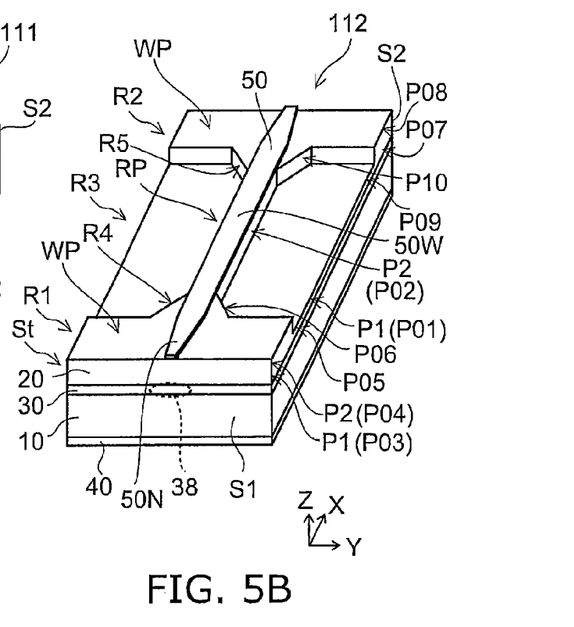
Figure 5C:
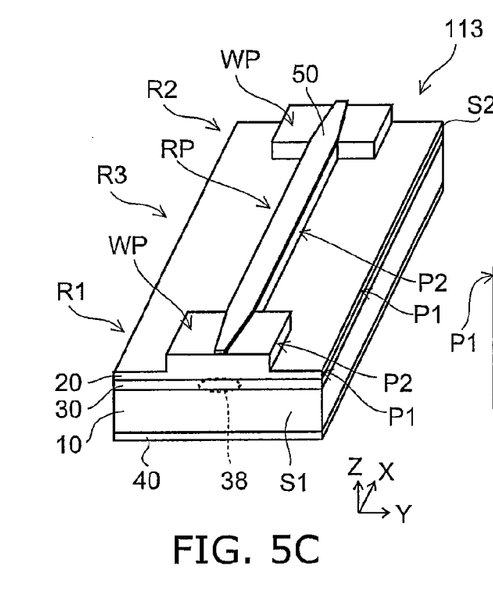
Figure 5D:
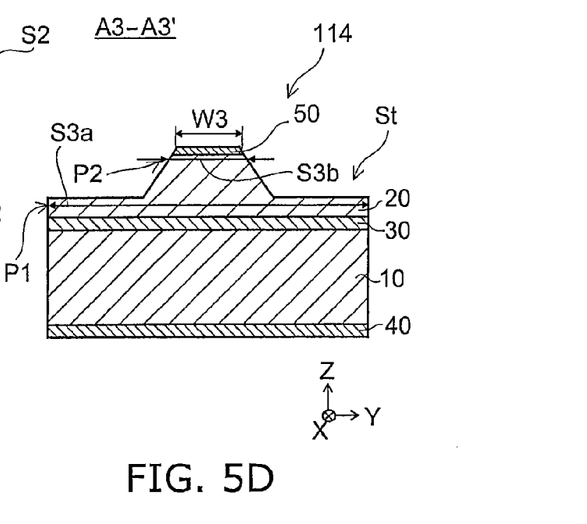

More specifically, FIGS. 5A to 5C are schematic perspective views illustrating the configuration of semiconductor light emitting devices 111-113 according to this embodiment. FIG. 5D is a schematic cross-sectional view illustrating the configuration of a semiconductor light emitting device 114 according to this embodiment and is a cross-sectional view corresponding to the A3-A3' cross section in FIG. 1A.

As shown in FIG. 5A, in the semiconductor light emitting device 111, the width (first upper width S1$b$) of the second portion P2 in the first region R1 is longer than the width (third upper width 53$b$) of the second portion P2 in the third region R3, but the width (second upper width S2$b$) of the second portion P2 in the second region R2 is equal to the width (third upper width S3$b$) of the second portion P2 in the third region R3.

Furthermore, the width (first electrode width W1) of the second electrode 50 in the first region R1 is narrower than the width (third electrode width W3) of the second electrode 50 in the third region R3. The rest is the same as in the semiconductor light emitting device 110.

As shown in FIG. 5B, in the semiconductor light emitting device 112, the width of the second portion P2 is changed not abruptly, but gradually, between the first region R1 and the second region R2 on one hand and the third region R3 on the other, and an intermediate region (a fourth region R4 and a fifth region R5) is provided between each of the first region R1 and the second region R2 on one hand and the third region R3 on the other. The rest is the same as in the semiconductor light emitting device 110. As shown in FIG.5B, the second semiconductor layer 20 further includes a fifth portion P05 and a sixth portion P06 provided in the fourth region R4, a seventh portion P07 and an eighth portion P08 provided in the second region R2, and a ninth portion P09 and a tenth portion P10 provided in the fifth region R5.

As shown In FIG. 5C, in the semiconductor light emitting device 113, the width (first upper width S1$b$ and second upper width S2$b$) of the second portion P2 in the first region R1 and the second region R2 is narrower than the width (first lower width S1$a$ and second lower width S2$a$) of the first portion P1. Furthermore, also in this case, the first upper width S1$b$ and the second upper width S2$b$ are wider than the third upper width S3$b$. That is, a ridge-shaped wide portion WP is provided in the first region R1 and the second region R2. Furthermore, the width of the ridge-shaped wide portion WP in the first region R1 and the second region R2 is wider than the width of the ridge portion RP in the third region R3. The rest is the same as in the semiconductor light emitting device 110. The wide portion WP in this case serves to confine light in the Y-axis direction. Furthermore, because the wide portion WP has a wider width than the ridge portion RP, it decreases optical density near the light emitting portion 38 at the first end surface S1, for instance, suppressing the occurrence of COD.

As shown in FIG. 5D, in the semiconductor light emitting device 114, the width (length along the Y-axis direction) in the third region R3 is continuously changed between the width (third upper width S3$b$) of the second portion P2 and the width (third lower width S3$a$) of the first portion P1. That is, the width along the second direction in the ridge portion RP continuously decreases from the light emitting layer 30 side of the ridge portion RP toward the second electrode 50 side of the ridge portion RR. Thus, the ridge portion RP in the third region R3 has a slope (tapered surface). That is, the ridge portion RP has a mesa structure. The rest is the same as in the semiconductor light emitting device 110.

The above semiconductor light emitting devices 111-114 can also improve reliability while maintaining high operating characteristics and reducing catastrophic optical damage.

It is noted that two or more of the configurations described with reference to the semiconductor light emitting devices 110-114 may be implemented in combination.

In the following, the characteristics of the semiconductor light emitting device according to this embodiment are further described.

Figure 6:
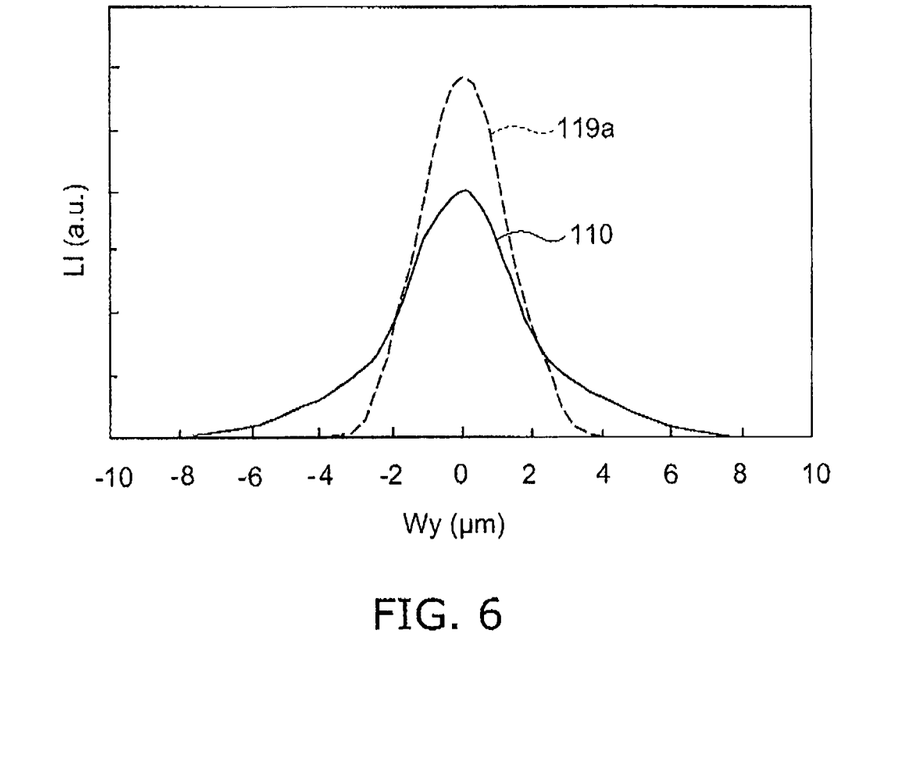
FIG. 6 is a graph illustrating the characteristics of the semiconductor light emitting device according to the first embodiment and the semiconductor light emitting device of the comparative example.

FIG. 6 is a graph illustrating the characteristics of the semiconductor light emitting device according to the first embodiment of the invention and the semiconductor light emitting device of the comparative example.

More specifically, FIG. 6 illustrates a simulation result of light emission characteristics in the semiconductor light emitting device 110 according to this embodiment and the semiconductor light emitting device 119$a$ of the first comparative example, where the horizontal axis represents position Wy in the Y-axis direction with reference to the center of the light emitting portion 38, and the vertical axis represents light intensity LI.

As shown in FIG. 6, in the semiconductor light emitting device 119$a$ of the first comparative example, the optical density is high at the center of the light emitting portion 38. Hence, COD is likely to occur.

In contrast, in the semiconductor light emitting device 110, the distribution of light intensity LI is broadened, and light is spread along the Y-axis direction. The optical density is decreased at the center of the light emitting portion 38, and the occurrence of COD is suppressed accordingly.

Simulation was performed on the thermal characteristics of the semiconductor light emitting device 110 thus configured and the semiconductor light emitting device 119$a$ of the first comparative example.

This simulation was based on a model in which the semiconductor light emitting device is mounted on a heat sink made of Cu. It was assumed that the conductive layer 55 provided on the second electrode 50 is opposed to the heat sink across an AuSn solder layer.

Here, as shown in FIGS. 1A to 1D, the distance between the first end surface S1 and the second end surface S2 is referred to as resonator length Lr, and the lengths along the X-axis direction of the first to third regions R1-R3 are referred to as first to third region lengths Lr1-Lr3, respectively. In this simulation, in the semiconductor light emitting device 110, the resonator length Lr was 600 μm (micrometers), the first region length Lr1 and the second region length Lr2 were each 100 μm, and the third region length Lr3 was 400 μm. The resonator length Lr was 600 μm also in the semiconductor light emitting device 119a.

This model was used to simulate the thermal resistance Rth at the light emitting end surface (first end surface S1) of the semiconductor light emitting device 119a of the first comparative example, and the thermal resistance Rth was 18.7 K/W. In contrast, the thermal resistance Rth at the light emitting end surface (first end surface S1) of the semiconductor light emitting device 110 according to this embodiment was 17.0 K/W. Thus, in the semiconductor light emitting device 110, the thermal resistance Rth can be reduced by 10% as compared with the semiconductor light emitting device 119a of the first comparative example. This is presumably because in the semiconductor light emitting device 110, the wide portion WP provided in the first region R1 (and the second region R2) increases the distance between the light emitting end surface (first end surface S1) and the insulating layer 60 as compared with the first comparative example and improves heat dissipation at the light emitting end surface.

Thus, at the first end surface S1, the optical density is reduced, and furthermore the heat dissipation can be improved. Accordingly, the reliability can be improved.

Figure 7A:
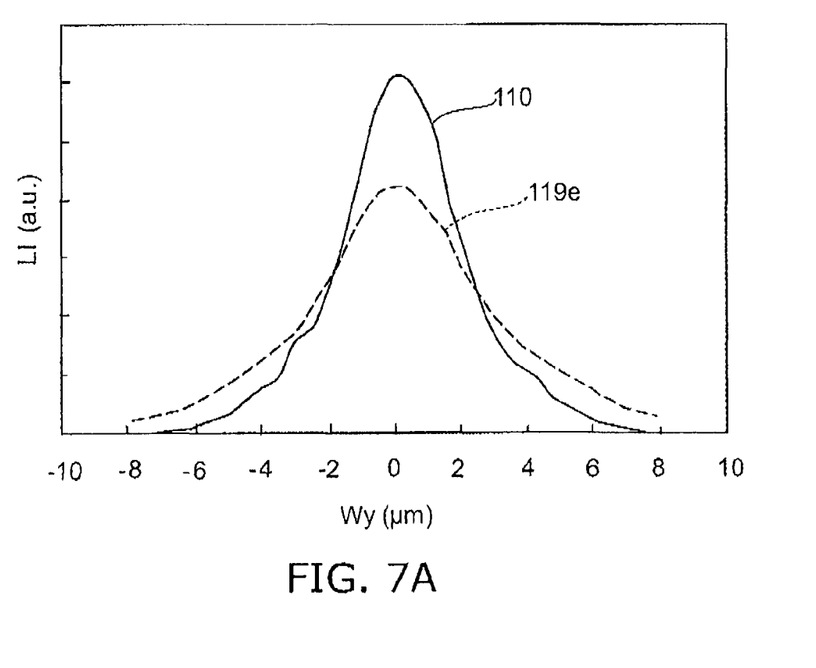
FIGS. 7A to 7C are schematic views illustrating the characteristics of the semiconductor light emitting device according to the first embodiment and the semiconductor light emitting device of the comparative example.
Figure 7B:
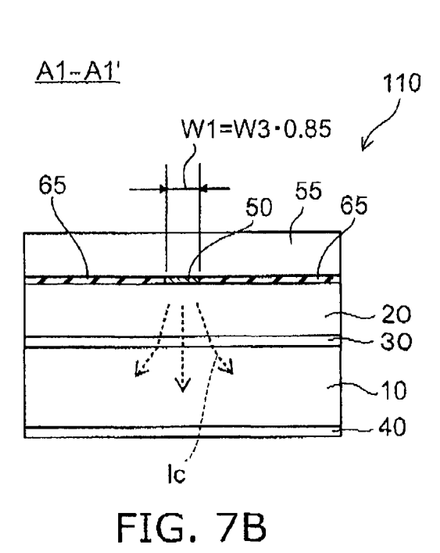
Figure 7C:
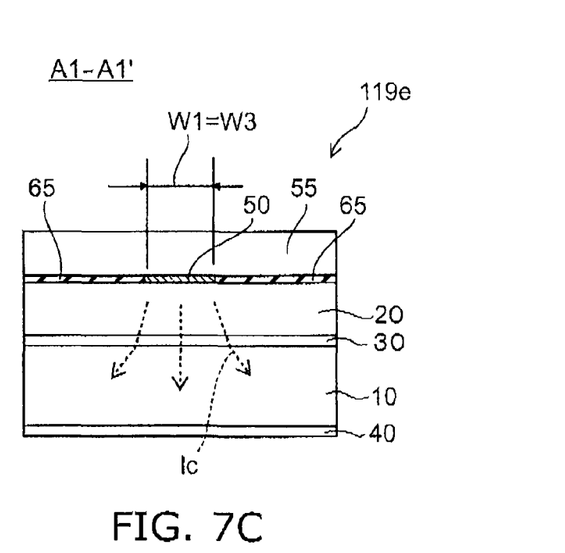

FIGS. 7A to 7C are schematic views illustrating the characteristics of the semiconductor light emitting device according to the first embodiment of the invention and the semiconductor light emitting device of the comparative example.

More specifically, FIG. 7A illustrates a simulation result of light emission characteristics in the semiconductor light emitting device 110 according to this embodiment and the semiconductor light emitting device 119e of the fifth comparative example, where the horizontal axis represents position Wy in the Y-axis direction with reference to the center of the light emitting portion 38, and the vertical axis represents light intensity LI. FIGS. 7B and 7C are cross-sectional views corresponding to the cross sections taken along line A1-A1' of FIG. 1A, illustrating the current characteristics in the semiconductor light emitting device 110 and the semiconductor light emitting device 119e, respectively.

In the semiconductor light emitting device 110, the width (first electrode width W1) of the second electrode 50 in the first region R1 is 0.85 times the width (third electrode width W3) of the second electrode 50 in the third region R3. On the other hand, in the semiconductor light emitting device 119e of the fifth comparative example, the first electrode width W1 is equal to the third electrode width W3.

As shown in FIG. 7A, in the semiconductor light emitting device 110, the light intensity LI is nearly zero when the position Wy from the center of the light emitting portion 38 is approximately ±6 μm or more.

In contrast, in the semiconductor light emitting device 119e of the fifth comparative example, the light intensity LI is not sufficiently decreased even if the position Wy is ±8 μm or more. That is, the distribution of light intensity LI along the Y-axis direction is excessively broad.

As shown in FIG. 7C, in the semiconductor light emitting device 119e, the second electrode 50 has a constant width, which is wide also in the first region R1. Hence, the flow direction of the current Ic spreads, increasing the ineffective current. This increases the threshold current and decreases the light emission efficiency.

In contrast, as shown in FIG. 7B, in the semiconductor light emitting device 110, the current injection region is reduced in the Y-axis direction, and the current Ic is constricted. Hence, the ineffective current can be decreased. This decreases the threshold current and increases the light emission efficiency.

Thus, the semiconductor light emitting device 110 can achieve high reliability while maintaining operating characteristics such as threshold current and light emission efficiency at high level and reducing catastrophic optical damage.

That is, in the semiconductor light emitting device 110, the optical density at the light emitting end surface is reduced, and the thermal resistance is reduced. Thus, the occurrence of COD is suppressed, and the reliability can be improved. Furthermore, the width of the second electrode 50 is narrowed at the light emitting end surface to constrict the current, and thereby it is possible to prevent the increase of threshold current and the decrease of light emission efficiency due to the absence of a narrow ridge portion RP at the light emitting end surface.

As described above, the length (at least one of the first electrode width W1 and the second electrode width W2) in the second direction of the second electrode 50 in at least one region (wide portion WP) of the first region R1 and the second region R2, where no ridge feature is provided or the width of the ridge feature is wider than in the third region R3, is preferably 0.85 times or less the length (third electrode width W3) in the second direction of the second electrode 50 in the third region R3. That is, the width of the narrow part of the second electrode 50 on the wide portion WP is preferably 0.85 times or less the width along the second direction of the second electrode 50 on the ridge portion RP. This serves for effective achievement of the current constriction effect, and the decrease of threshold current and the increase of light emission efficiency can be effectively achieved. However, the invention is not limited thereto as long as at least one of the first electrode width W1 and the second electrode width W2 is smaller than the third electrode width W3.

Figure 8:
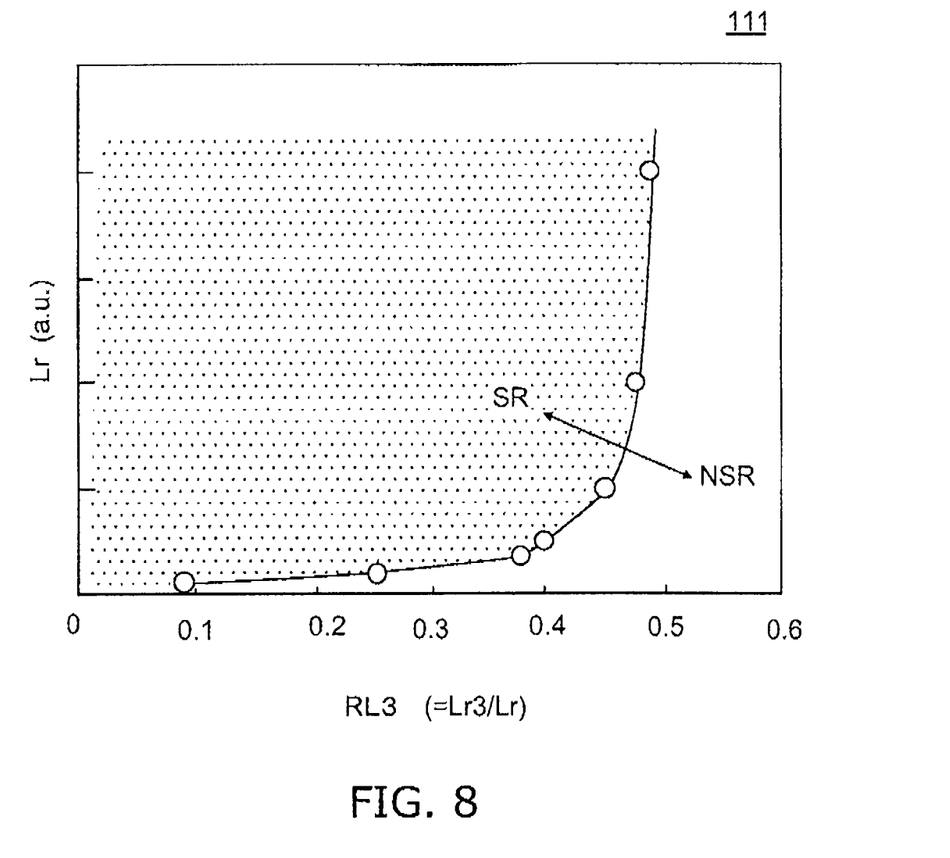
FIG. 8 is a graph illustrating the characteristics of the semiconductor light emitting device according to the first embodiment.

FIG. 8 is a graph illustrating the characteristics of the semiconductor light emitting device according to the first embodiment of the invention.

More specifically, FIG. 8 illustrates a simulation result of light intensity LI with the length of the third region R3 varied in the semiconductor light emitting device 111 (the configuration In which the second region R2 includes a ridge feature similar to that in the third region R3 and the first region R1 includes a wide portion WP) according to this embodiment. That is, the reflectance at the light emitting end surface was simulated by varying the resonator length Lr and the third region length ratio RL3 (=Lr3/Lr), which is the ratio of the third region length Lr3 to the resonator length Lr. Then, the condition was determined under which the reflectance does not fall below that of the semiconductor light emitting device 119a of the first comparative example in which the ridge portion RPa is provided entirely in the first to third regions R1-R3. In FIG. 8, the horizontal axis represents the third region length ratio RL3, and the vertical axis represents the resonator length Lr in an arbitrary scale. The lower and right side of the curve in FIG. 8 is the region NSR for the condition under which the reflectance does not fall below that of the semiconductor light emitting device 119a, and the upper and left side of the curve is the region SR for the condition under which the reflectance falls below that of the semiconductor light emitting device 119a.

As shown in FIG. 8, as the third region length ratio RL3 decreases, the resonator length Lr that the reflectance does not fall decreases. When the third region length ratio RL3 is less than 0.5, the resonator length Lr that the reflectance dose not fall sharply decreases. Hence, the third region length ratio RL3 is preferably 0.5 or more.

Thus, the length (third region length Lr3) in the first direction (X-axis direction) of the second portion P2 in the third region R3 is preferably 0.5 times or more the distance (resonator length Lr) between the first end surface S1 and the second end surface 52. That is, the length in the first direction of the ridge portion RP is preferably 0.5 times or more the distance between the first end surface S1 and the second end surface 52. This relaxes restrictions on the resonator length Lr that the reflectance does not fall. Thus, it is possible to provide a semiconductor light emitting device, which is easy to use in wider design range.

It is noted that FIG. 8 shows the result for the semiconductor light emitting device 111 having the configuration in which a ridge feature is provided in the second region R2, and if the third region length ratio RL3 is 0.5 or more, the ratio of the first region length Lr1 to the resonator length Lr is less than 0.5. Likewise, for the semiconductor light emitting device 110 with the wide portion WP provided in both the first region R1 and the second region R2, if the third region length ratio RL3 is 0.5 or more, the ratio of the total length of the first region length Lr1 and the second region length Lr2 to the resonator length Lr is less than 0.5.

Second Embodiment

FIGS. 9A to 9D are schematic views illustrating the configuration of a semiconductor light emitting device according to a second embodiment of the invention.

Figure 9A:
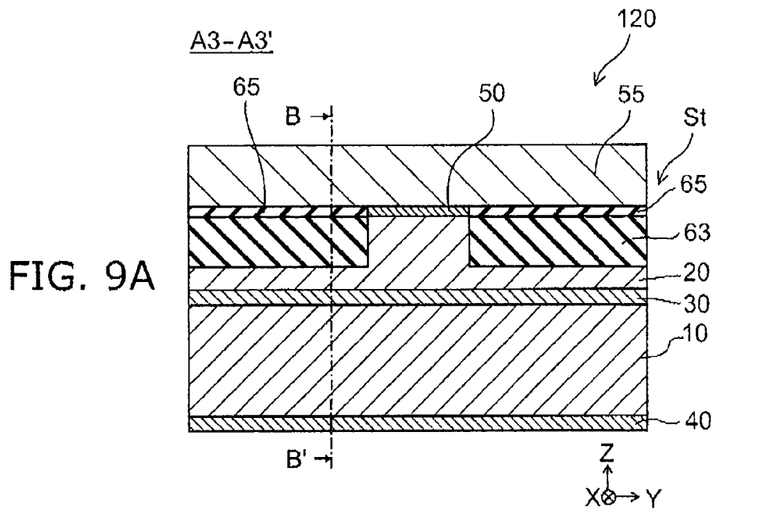
FIGS. 9A to 9D are schematic views illustrating a semiconductor light emitting device according to a second embodiment.
Figures 9B, 9C:
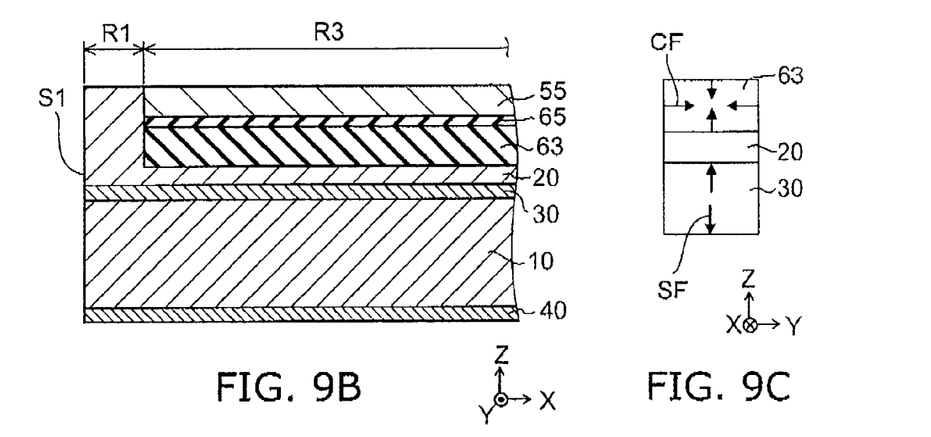
Figure 9D:
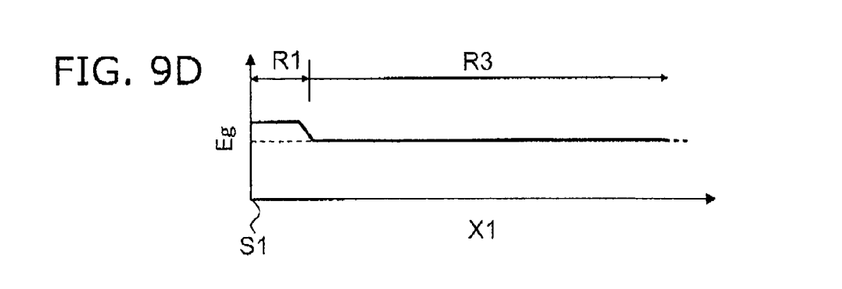

More specifically, FIG. 9A is a schematic cross-sectional view of a semiconductor light emitting device 120 according to this embodiment and is a cross-sectional view corresponding to the cross section taken along line A3-A3' of FIG. 1A. FIG. 9B is a cross-sectional view taken along line B-W of FIG. 9A, FIG. 9C is a schematic view illustrating compressive stress, and FIG. 9D is an energy band diagram of the light emitting layer 30.

As shown in FIG. 9A, in addition to the first semiconductor layer 10, the light emitting layer 30, the second semiconductor layer 20, the first electrode 40, and the second electrode 50 described with reference to the first embodiment, the semiconductor light emitting device 120 according to this embodiment further includes an insulating layer 63 provided on the surface on the second electrode 50 side of the first portion P1 of the second semiconductor layer 20 and having a compressive stress. That is, the semiconductor light emitting device 120 further includes an insulating layer 63 provided on the surface on the second electrode 50 side of the portion on the light emitting layer 30 side of the ridge portion RP and having a compressive stress.

In other words, in the semiconductor light emitting device 120, an insulating layer 63 made of a material having a compressive stress is used as the insulating layer 60 in the semiconductor light emitting device 110. The configuration other than the insulating layer 63 can be the same as that of the semiconductor light emitting device 110.

The material having a compressive stress used for the insulating layer 63 can illustratively include SiN and AlN. On the other hand, as described above, the p-AlGaN cladding layer 24 serving as the cladding layer of the second semiconductor layer 20 is an AlGaN layer (such as a Mg-doped AlGaN layer).

As shown in FIG. 9B, the insulating layer 63 is provided in the third region R3 and not provided in the first region R1 (and the second region R2).

As shown in FIG. 9C, because the insulating layer 63 has a compressive stress CF, a tensile stress SF along the Z-axis direction is applied to the light emitting layer 30 in the third region R3. That is, a tensile stress along the C-axis direction is applied to the light emitting layer 30.

By this tensile stress, the lattice spacing along the Z-axis direction (stacking direction) in the third region R3 of the crystal included in the light emitting layer 30 becomes larger than the lattice spacing along the Z-axis direction in at least one of the first region R1 and the second region R2 of the crystal included in the light emitting layer 30. That is, the lattice spacing along the stacking direction of the crystal included in the light emitting layer 30 below the ridge portion RP becomes larger than the lattice spacing in the crystal below the wide portion WP. It is noted that the difference between the lattice spacing in the third region R3 and the lattice spacing in at least one of the first region R1 and the second region R2 can be detected illustratively by Raman spectroscopic analysis.

Here, as shown in FIG. 9D, the energy Eg of the light emitting layer 30 in the first region R1 is higher than the energy Eg of the light emitting layer 30 in the third region R3. That is, the energy of the light emitting layer 30 at the first end surface S1 (light emitting end surface) increases relative to that in the third region R3.

Thus, the band gap increases at the light emitting end surface, suppressing optical absorption. Hence, the occurrence of COD is further suppressed.

Furthermore, in the semiconductor light emitting device 120, the insulating layer 63 having a compressive stress is not provided in the first region R1. This decreases the stress applied to the light emitting layer 30 at the first end surface S1 (light emitting end surface), and the decrease of crystallinity due to this stress can be prevented. Furthermore, the adhesiveness of the end surface coating film formed on the first end surface S1 and the second end surface S2 is improved. This suppresses cracks in the end surface coating film, and hence the reliability can be further improved.

Thus, in the configuration of the semiconductor light emitting device 120, an insulating layer 63 having a compressive stress is provided in the third region R3, and the insulating layer 63 is not provided in the first region R1 (and the second region R2). Thus, the tensile stress applied to the light emitting layer 30 is made relatively higher in the third region R3 than in the first region R1 (and the second region R2), and thereby the lattice spacing of the light emitting layer 30 in the third region R3 is made larger than in the first region R1 (and the second region R2). That is, in the first region R1 (and the second region R2), the light emitting layer 30 is overlaid with the second semiconductor layer 20 instead of the insulating layer 63, and the aforementioned difference in tensile stress occurs due to the difference between the compressive stress of the second semiconductor layer 20 and the compressive stress of the insulating layer 63. Hence, the insulating layer 63 preferably has a larger compressive stress than the second semiconductor layer 20. In particular, the compressive stress of the insulating layer 63 is preferably larger than the compressive stress of the layer existing in the first region R1 (and the second region R2) at the position in the Z-axis direction (stacking direction) where the insulating layer 63 is located in the third region R3.

That is, the compressive stress in the insulating layer 63 is preferably larger than the compressive stress in the cladding layer included in the second semiconductor layer 20. Thus, the lattice spacing of the light emitting layer 30 in the third region R3 based on the compressive stress of the insulating layer 63 can be reliably made larger than the lattice spacing of the light emitting layer 30 in the first region R1 (and second region R2). This can reliably produce difference in the energy Eg of the light emitting layer 30 between the first region R1 (and the second region R2) and the third region R3 and can reliably achieve the effect of suppressing optical absorption at the light emitting end surface.

The embodiments of the invention are applicable to semiconductor laser devices based on compound semiconductor materials, particularly to semiconductor laser devices based on nitrogen-containing compound semiconductors such as GaN, AlGaN, InGaN, and InGaAlN.

In the specification of the application, "perpendicular" and "parallel" refer to not only strictly perpendicular and strictly parallel but also include, for instance, the fluctuation due to manufacturing processes, etc. It is sufficient to be substantially perpendicular and substantially parallel.

The embodiments of the invention have been described with reference to examples. However, the invention is not limited to these examples. For instance, various specific configurations of the components, such as the first semiconductor layer, second semiconductor layer, light emitting layer, first electrode, second electrode, insulating layer, and interlayer insulating film, constituting the semiconductor light emitting device are encompassed within the scope of the invention as long as those skilled in the art can similarly practice the invention and achieve similar effects by suitably selecting such configurations from conventionally known ones.

Furthermore, any two or more components of the examples can be combined with each other as long as technically feasible, and such combinations are also encompassed within the scope of the invention as long as they fall within the spirit of the invention.

Furthermore, those skilled in the art can suitably modify and implement the semiconductor device described above in the embodiments of the invention, and all the semiconductor devices thus modified are also encompassed within the scope of the invention as long as they fall within the spirit of the invention.

Furthermore, those skilled in the art can conceive various modifications and variations within the spirit of the invention, and it is understood that such modifications and variations are also encompassed within the scope of the invention.

The invention claimed is:

1. A semiconductor light emitting device comprising:
   a stacked body including a first semiconductor layer of a first conductivity type, a second semiconductor layer of a second conductivity type, and a light emitting layer provided between the first semiconductor layer and the second semiconductor layer, the stacked body having a stacking direction from the first semiconductor layer to the second semiconductor layer, a first direction perpendicular to the stacking direction, and a second direction perpendicular to the first direction and the stacking direction, the stacked body having a first end surface and a second end surface opposed to the first end surface in the first direction;
   a first electrode provided in contact with the first semiconductor layer, the first semiconductor layer being disposed between the first electrode and the light emitting layer; and
   a second electrode provided in contact with the second semiconductor layer, the second semiconductor layer being disposed between the second electrode and the light emitting layer,
   light emitted from the light emitting layer being resonated between the first end surface and the second end surface,
   the second semiconductor layer including:
      a first region in contact with the first end surface,
      a second region in contact with the second end surface,
      a third region provided between the first region and the second region,
      a fourth region provided between the first region and the third region,
   the second semiconductor layer including,
      a first portion provided in the third region, and
      a second portion provided in the third region, the first portion being disposed between the second portion and the light emitting layer,
      a width of the second portion along the second direction being narrower than a width of the first portion along the second direction; and
      a third portion provided in the first region, a width of the third portion along the second direction being wider than the width of the second portion along the second direction,
      a fourth portion provided in the first region, the third portion being disposed between the fourth portion and the light emitting layer,
      a width of the fourth portion along the second direction being wider than the width of the second portion along the second direction,
      a fifth portion provided in the fourth region, a width of the fifth portion along the second direction being wider than the width of the second portion along the second direction, and
      a sixth portion provided in the fourth region, the fifth portion being disposed between the sixth portion and the light emitting layer, a width of the sixth portion along the second direction being wider than the width of the second portion along the second direction, the width of the sixth portion along the second direction increasing along a direction from the third region toward the first region, and
   the second electrode including a narrow part and a wide part, the narrow part being in contact with the fourth portion, the wide part being in contact with the second portion, a width of the narrow part along the second direction being narrower than a width of the wide part along the second direction and narrower than the width of the fourth portion along the second direction.

2. The device according to claim 1, wherein a length in the first direction of the third region is 0.5 times or more a distance between the first end surface and the second end surface.

3. The device according to claim 1, wherein the width of the narrow part of the second electrode on the fourth portion is 0.85 times or less the width along the second direction of the second electrode on the second portion.

4. The device according to claim 1, wherein the first conductivity type is n-type, and the second conductivity type is p-type.

5. The device according to claim 1, wherein at least one of the light emitting layer at the first end surface and the light emitting layer at the second end surface includes a light emitting end portion.

6. The device according to claim 1, wherein the light emitting layer includes a plurality of barrier layers and a well layer, provided between each of the plurality of barrier layers.

7. The device according to claim 1, wherein the width of the fourth portion along the second direction is narrower than the width of the third portion along the second direction.

8. The device according to claim 1, wherein the second electrode is provided substantially in contact with the first end surface and the second end surface, and a current is injected into the stacked body in a substantially entire area along the first direction between the first end surface and the second end surface opposed to each other.

9. The device according to claim 1, further comprising:
an insulating layer provided on a surface on a side of the second electrode of a portion on a side of the light emitting layer of the ridge portion and the insulating layer having a compressive stress.

10. The device according to claim 9, wherein the insulating layer is not provided in the wide portion.

11. The device according to claim 9, wherein the insulating layer includes at least one of SiN and AlN.

12. The device according to claim 9, wherein the compressive stress in the insulating layer is larger than a compressive stress in a cladding layer included in the second semiconductor layer.

13. The device according to claim 12, wherein the insulating layer includes at least one of SiN and AlN, and the cladding layer includes AlGaN.

14. The device according to claim 1, wherein a lattice spacing along the stacking direction of crystal included in the light emitting layer below the ridge portion is larger than a lattice spacing in the crystal below the wide portion.

15. The device according to claim 1, wherein a tensile stress along the stacking direction is applied to the light emitting layer.

16. The device according to claim 1, wherein at least one of the first semiconductor layer, the second semiconductor layer, and the light emitting layer includes a compound semiconductor material.

17. The device according to claim 1, wherein at least one of the first semiconductor layer, the second semiconductor layer, and the light emitting layer includes at least one of GaN, AlGaN, InGaN, and InGaAlN.

18. The device according to claim 1, wherein the first electrode includes at least one of Ti, Pt, and Au, and the second electrode includes at least one of Ni and Au.

19. The device according to claim 1, wherein
the second semiconductor layer further includes a fifth region provided between the second region and the third region,
the second semiconductor layer further includes a seventh portion provided in the second region, an eighth portion provided in the second region, a ninth portion provided in the fifth region and a tenth portion provided in the fifth region,
the seventh portion is disposed between the eighth portion and the light emitting layer,
the ninth portion is disposed between the tenth portion and the light emitting layer,
a width of the seventh portion along the second direction is wider than the width of the second portion along the second direction,
a width of the eighth portion along the second direction is wider than the width of the second portion along the second direction,
a width of the ninth portion along the second direction is wider than the width of the second portion along the second direction,
a width of the tenth portion along the second direction is wider than the width of the second portion along the second direction, and
the width of the tenth portion along the second direction increases along a direction from the third region toward the second region.

20. The device according to claim 1, wherein
a length in the first direction of the fourth portion is constant along the second direction,
the width of the fourth portion along the second direction is wider than a maximum value of the width of the sixth portion along the second direction.

21. The device according to claim 20, wherein the width of the fourth portion along the second direction is same as the width of the third portion along the second direction.

22. The device according to claim 21, wherein the width of the fourth portion along the second direction is same as a width of the first semiconductor layer in the first region along the second direction.

23. The device according to claim 19, wherein
a length in the first direction of the eighth portion is constant along the second direction,
the width of the eighth portion along the second direction is wider than a maximum value of the width of the tenth portion along the second direction.

24. The device according to claim 23, wherein the width of the eighth portion along the second direction is same as the width of the seventh portion along the second direction.

25. The device according to claim 24, wherein the width of the eighth portion along the second direction is same as a width of the first semiconductor layer in the second region along the second direction.

* * * * *